(12) United States Patent
Zhou

(10) Patent No.: US 11,967,392 B2
(45) Date of Patent: Apr. 23, 2024

(54) METHOD AND APPARATUS FOR TESTING FAILURE OF MEMORY, STORAGE MEDIUM, AND ELECTRONIC DEVICE

(71) Applicant: CHANGXIN MEMORY TECHNOLOGIES, INC., Hefei (CN)

(72) Inventor: Chenggong Zhou, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 127 days.

(21) Appl. No.: 17/841,673

(22) Filed: Jun. 16, 2022

(65) Prior Publication Data
US 2023/0290425 A1   Sep. 14, 2023

Related U.S. Application Data

(63) Continuation of application No. PCT/CN2022/088823, filed on Apr. 24, 2022.

(30) Foreign Application Priority Data

Mar. 9, 2022  (CN) .......................... 202210225517.5

(51) Int. Cl.
| | |
|---|---|
| *G11C 29/46* | (2006.01) |
| *G11C 7/08* | (2006.01) |
| *G11C 29/12* | (2006.01) |
| *G11C 29/44* | (2006.01) |

(52) U.S. Cl.
CPC ................ *G11C 29/46* (2013.01); *G11C 7/08* (2013.01); *G11C 29/12005* (2013.01); *G11C 29/4401* (2013.01); *G11C 2029/1202* (2013.01); *G11C 2029/1204* (2013.01)

(58) Field of Classification Search
CPC ....... G11C 29/4401; G11C 7/08; G11C 29/50; G11C 29/46; G11C 29/025; G11C 29/50016; G11C 29/12005; G11C 2029/5006; G11C 2029/1202; G11C 2029/1204
See application file for complete search history.

(56) References Cited

U.S. PATENT DOCUMENTS

| | | | | |
|---|---|---|---|---|
| 5,034,923 | A * | 7/1991 | Kuo ....................... | G11C 29/02 365/201 |
| 6,195,771 | B1 * | 2/2001 | Tanabe ................... | G11C 29/44 365/201 |
| 6,934,206 | B2 | 8/2005 | Wang | |

(Continued)

*Primary Examiner* — Tuan T Nguyen
(74) *Attorney, Agent, or Firm* — Kilpatrick Townsend & Stockton LLP

(57) ABSTRACT

There are provided a method for testing failure of a memory, an apparatus for testing failure of a memory, a computer-readable storage medium, and an electronic device. The method for testing failure of a memory includes: writing preset storage data into a storage array of the memory (S310); raising a bit line voltage, and controlling a part of word lines of the storage array to enter a test mode (S320); exiting the test mode after waiting for preset time (S330); turning off sense amplifiers corresponding to a preset part of bit lines, and reading data from a remaining part of the bit lines (S340); comparing the data read from the remaining part of the bit lines with the preset storage data to obtain a comparison result (S350); and determining a failure state of the memory according to the comparison result (S360).

17 Claims, 4 Drawing Sheets

(56) References Cited

U.S. PATENT DOCUMENTS

| | | | |
|---|---|---|---|
| 2002/0176306 A1* | 11/2002 | Abe | G11C 29/50 |
| | | | 365/226 |
| 2018/0047457 A1* | 2/2018 | Tanaka | G11C 29/50016 |
| 2020/0089566 A1* | 3/2020 | You | G11C 29/1201 |
| 2023/0402105 A1* | 12/2023 | Guo | G11C 11/5642 |

* cited by examiner

METHOD AND APPARATUS FOR TESTING FAILURE OF MEMORY, STORAGE MEDIUM, AND ELECTRONIC DEVICE

CROSS-REFERENCE TO RELATED APPLICATION

The present disclosure is a continuation of PCT/CN2022/088823, filed on Apr. 24, 2022, which claims priority to Chinese Patent Application No. 202210225517.5, titled "METHOD AND APPARATUS FOR TESTING FAILURE OF MEMORY, STORAGE MEDIUM, AND ELECTRONIC DEVICE" and filed on Mar. 9, 2022, the entire contents of which are incorporated herein by reference.

TECHNICAL FIELD

The present disclosure relates to the field of data processing technology, and more particularly, to a method for testing failure of a memory, an apparatus for testing failure of a memory, a computer-readable storage medium, and an electronic device.

BACKGROUND

As a semiconductor memory device commonly used in computers, Dynamic Random Access Memory (DRAM) has been widely used in the computer field and the electronics industry due to its simple structure, high density, low power consumption, and low price, etc.

In a cell-to-cell leakage current test (cell to cell test) of a storage array of a DRAM product, leakage current of cell may be tested by means of voltage difference, to detect chips having potential risks.

However, the existing test method needs to continuously and gradually refresh the voltage difference between array cells, resulting in a longer test process and lower test accuracy.

SUMMARY

According to one aspect of the present disclosure, there is provided a method for testing failure of a memory. The method includes: writing preset storage data into a storage array of the memory; raising a bit line voltage, and controlling a part of word lines of the storage array to enter a test mode; exiting the test mode after waiting for preset time; turning off sense amplifiers corresponding to a preset part of bit lines, and reading data from a remaining part of the bit lines; comparing the data read from the remaining part of the bit lines with the preset storage data to obtain a comparison result; and determining a failure state of the memory according to the comparison result.

According to another aspect of the present disclosure, an apparatus for testing failure of a memory is provided. The apparatus includes: a data write circuit configured to write preset storage data into a storage array of the memory; a test circuit configured to raise a bit line voltage, control a part of word lines of the storage array to enter a test mode, and exit the test mode after waiting for preset time; a data read circuit configured to turn off sense amplifiers corresponding to a preset part of bit lines, and read data from a remaining part of the bit lines; a comparison circuit configured to compare the data read from the remaining part of the bit lines with the preset storage data to obtain a comparison result; and a determination circuit configured to determine a failure state of the memory according to the comparison result.

According to yet another aspect of the present disclosure, there is provided a computer-readable storage medium storing a computer program thereon. The computer program is executable by a processor, whereby the method for testing failure of a memory is implemented.

According to still another aspect of the present disclosure, there is provided an electronic device, which includes: a processor; and a memory configured to store executable instructions of the processor. The processor is configured to execute the executable instructions to implement the method for testing failure of a memory.

It is to be understood that the above general description and the detailed description below are merely exemplary and explanatory, and do not limit the present disclosure.

BRIEF DESCRIPTION OF THE DRAWINGS

The accompanying drawings herein are incorporated in and constitute a part of this specification, illustrate embodiments conforming to the present disclosure and, together with the specification, serve to explain the principles of the present disclosure. Apparently, the accompanying drawings in the following description show merely some embodiments of the present disclosure, and persons of ordinary skill in the art may still derive other drawings from these accompanying drawings without creative efforts.

DETAILED DESCRIPTION

The exemplary embodiments will now be described more fully with reference to the accompanying drawings. However, the exemplary embodiments can be implemented in a variety of forms and should not be construed as being limited to the embodiments set forth herein. Rather, these embodiments are provided such that the present disclosure will be more thorough and complete and will fully convey the concepts of the exemplary embodiments to those skilled in the art. Throughout the drawings, similar reference signs indicate the same or similar structures, and thus their detailed description will be omitted.

Although this specification uses relativity terms such as "above" and "below" to describe a relative relation between one component and another component of icons, these terms are merely for convenience of this specification, for example, the directions of the examples in the accompanying drawings. It is to be understood that when the apparatus of the icon are turned upside down, components described as "above" will become components described as "below".

Other relative terms such as "high", "low", "top", "bottom", "left", "right" and so on also have similar meanings. When a certain structure is "above" other structures, it likely means that the certain structure is integrally formed on the other structures, or the certain structure is "directly" arranged on the other structures, or the certain structure is "indirectly" arranged on the other structures by means of another structure.

The terms "one", "a" and "the" are intended to mean that there exists one or more elements/constituent parts/etc. The terms "comprising" and "having" are intended to be inclusive and mean that there may be additional elements/constituent parts/etc. other than the listed elements/constituent parts/etc.

A semiconductor memory is used in computers, servers, handheld devices such as mobile phones, printers, and many other electronic devices and applications. The semiconductor memory includes a plurality of memory cells in a memory array, where each of the plurality of memory cells stores at least one bit of information. Dynamic Random Access Memory (DRAM) is an example of such a semiconductor memory. This solution is used in the DRAM. Therefore, the following description of the embodiments is made with reference to the DRAM as a non-limiting example.

In a DRAM integrated circuit device, memory cell arrays are typically arranged in rows and columns, such that a particular memory cell may be addressed by specifying a row and a column of an array of this memory cell. In a read operation, a corresponding sense amplifier is selected to achieve output of data in this memory cell.

Figure 1:
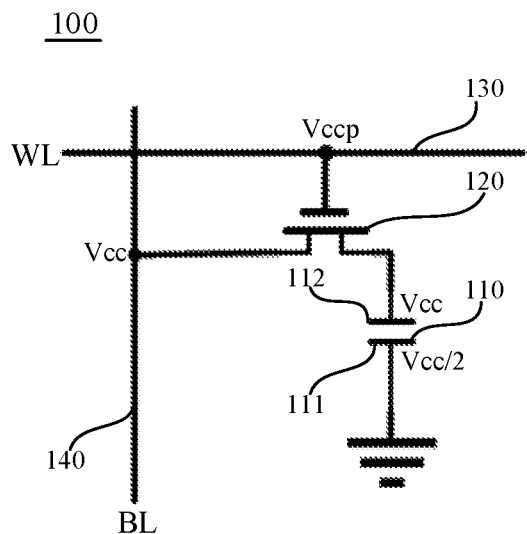
FIG. 1 schematically illustrates a schematic structural diagram of a memory cell in a DRAM according to an exemplary embodiment of the present disclosure.

Referring to FIG. 1, each of the plurality of memory cells 100 in the DRAM generally includes a capacitor 110, a transistor 120, a word line (WL) 130, and a bit line (BL) 140. A gate of the transistor 120 is connected to the WL 130, a drain of the transistor 120 is connected to the BL 140, and a source of the transistor 120 is connected to the capacitor 110. A voltage signal on the WL 130 can control on/off of the transistor 120, such that data information stored in the capacitor 110 can be read through the BL 140, or the data information can be written into the capacitor 110 through the BL 140 for storage.

Figure 2:
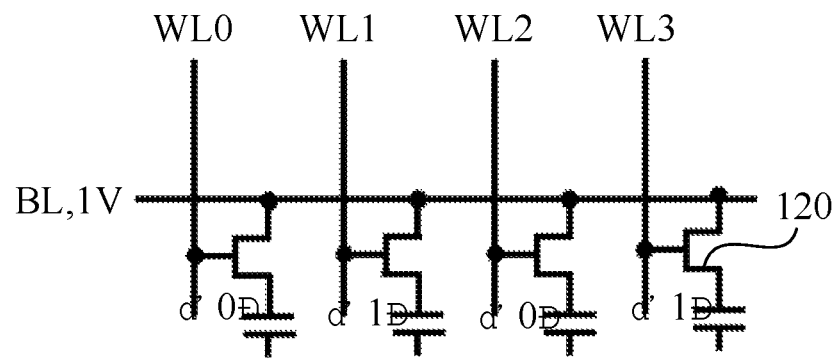
FIG. 2 schematically illustrates a schematic structural diagram of a storage array in a DRAM according to an exemplary embodiment of the present disclosure.

A storage array typically comprises a plurality of memory cells. Referring to FIG. 2, one BL corresponds to a plurality of WLs arranged at intervals. A given one of the plurality of WLs may control on/off of the corresponding transistor 120. When the memory cell comprising the WL 130, the BL 140 and the transistor 120 has a leakage current, electrons stored in the memory cell may leak out through a weak point, causing voltage distortion in the memory cell.

Therefore, it is of great significance to perform a failure test on the memory to determine a failure state of the memory.

Figure 3:
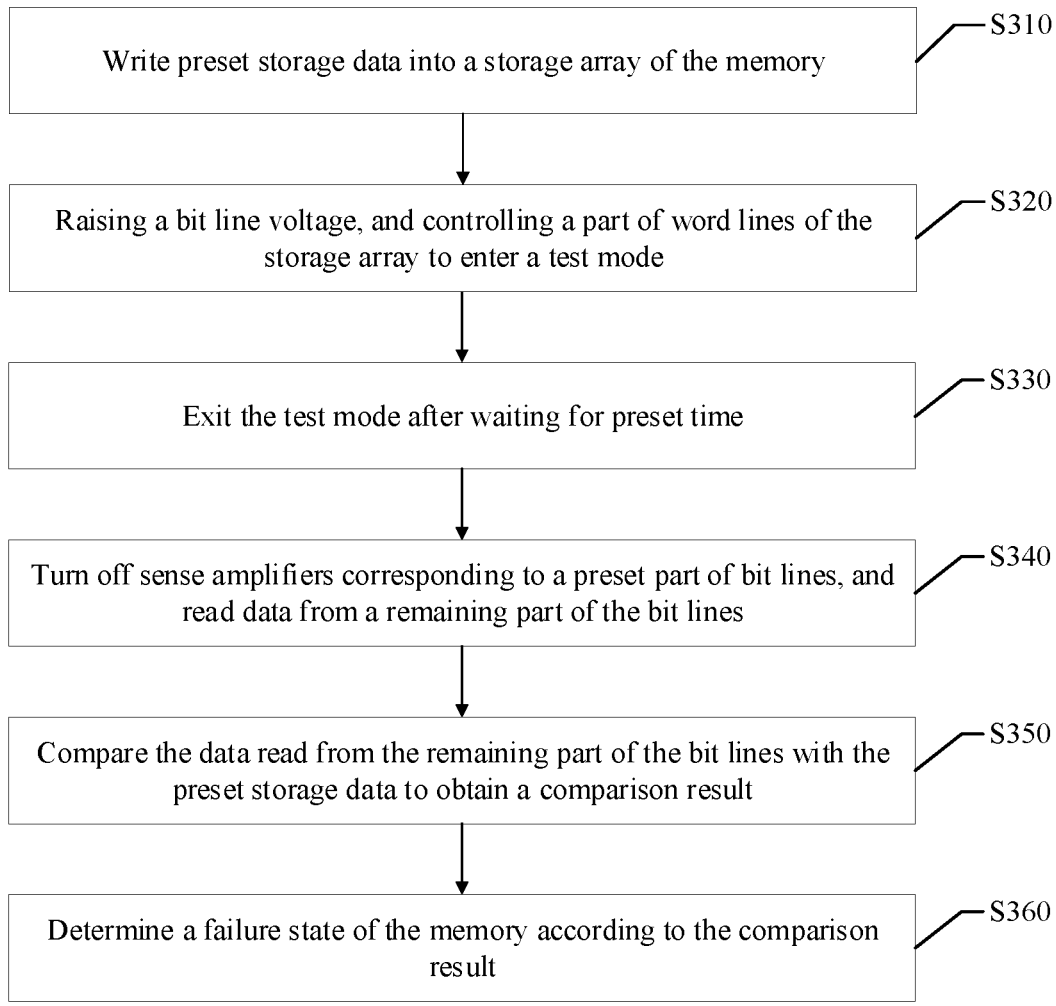
FIG. 3 schematically illustrates a flowchart of a method for testing failure of a memory according to an exemplary embodiment of the present disclosure.

Referring to FIG. 3, the method for testing failure of a memory provided by the exemplary embodiments of the present disclosure may include following steps:

Step S310: writing preset storage data into a storage array of the memory;

Step S320: raising a bit line voltage, and controlling a part of word lines of the storage array to enter a test mode;

Step S330: exiting the test mode after waiting for preset time;

Step S340: turning off sense amplifiers corresponding to a preset part of bit lines, and reading data from a remaining part of the bit lines;

Step S350: comparing the data read from the remaining part of the bit lines with the preset storage data to obtain a comparison result; and Step S360: determining a failure state of the memory according to the comparison result.

In the method for testing failure of a memory provided by the exemplary embodiments of the present disclosure, in one aspect, the preset storage data is written into the storage array of the memory and the bit line voltage is raised, such that when a part of word lines of the storage array enter the test mode, data in memory cells corresponding to this part of word lines may be remained at "1", i.e., a high voltage, thereby ensuring that there is a voltage difference between adjacent memory cells whose data is "0". In addition, sense amplifiers corresponding to a preset part of bit lines are turned off, data are only read from a remaining part of the bit lines, the read data are compared with the preset storage data to obtain a comparison result, and a failure state of the memory may be determined according to the comparison result. In another aspect, in the embodiments of the present disclosure, by raising the bit line voltage and controlling a part of word lines to enter the test mode, and by controlling the data in the memory cells corresponding to this part of word lines to be remained at "1", a state of presence of the voltage difference may be continuously provided, without continuously refreshing array cells, such that total time consumed in the test process is reduced, and test efficiency is improved. In addition, the data in other adjacent memory cells around the memory cell to be tested whose preset storage data is "0" is remained at "1". Therefore, it can be quickly and accurately decide whether the memory cell to be tested fails by obtaining data in the memory cell to be tested.

In conjunction with different preset storage data, the method for testing failure of a memory provided by the exemplary embodiments of the present disclosure will be described in detail below.

In practical applications, the preset storage data may include first topology data, second topology data, third topology data or fourth topology data, and different topology data are configured for testing different memory cells.

Referring to Table 1, a distribution structure of the first topology data SUR1_0 is shown. After the first topology data is written into the memory, "1" is written into memory cells corresponding to odd-row word lines (WL1, WL3, WL5, WL7 . . . ) and memory cells corresponding to odd-column bit lines (BL1, BL3, BL5, BL7 . . . ) in the memory, and "0" is written into rest of the memory cells.

TABLE 1

| SUR1_0 | WL0 | WL1 | WL2 | WL3 | WL4 | WL5 | WL6 | WL7 |
|---|---|---|---|---|---|---|---|---|
| BL0 | 0 | 1 | 0 | 1 | 0 | 1 | 0 | 1 |
| BL1 | 1 | 1 | 1 | 1 | 1 | 1 | 1 | 1 |
| BL2 | 0 | 1 | 0 | 1 | 0 | 1 | 0 | 1 |
| BL3 | 1 | 1 | 1 | 1 | 1 | 1 | 1 | 1 |
| BL4 | 0 | 1 | 0 | 1 | 0 | 1 | 0 | 1 |
| BL5 | 1 | 1 | 1 | 1 | 1 | 1 | 1 | 1 |
| BL6 | 0 | 1 | 0 | 1 | 0 | 1 | 0 | 1 |
| BL7 | 1 | 1 | 1 | 1 | 1 | 1 | 1 | 1 |

In an exemplary embodiment of the present disclosure, after the first topology data is written into the storage array of the memory, a bit line (BL) voltage is raised. That is, the voltage of a BL is raised from a precharge voltage to an operating voltage, which is equivalent to turning on the BL, and the voltage of the BL may become 1V, as shown in FIG. 2.

Next, a part of word lines of the storage array are controlled to enter a test mode, which is equivalent to turning on the part of the word lines in the entire storage array, such that charges on the BL may be shared onto transistor capacitors corresponding to the part of the word lines, and thus data stored in the capacitors corresponding to the part of the word lines is remained at "1".

For the first topology data, the second topology data, the third topology data and the fourth topology data mentioned above, the controlling a part of word lines of the storage array to enter a test mode includes: controlling to power up odd-row word lines or even-row word lines of the storage array to enter the test mode. In some embodiments, for the first topology data, it is mainly to control to power on the odd-row word lines of the storage array to enter the test mode. That is, a voltage of the odd-row word lines is maintained at a high voltage, referring to FIG. 2.

In this exemplary embodiment of the present disclosure, the test mode is exited after waiting for preset time, which refers to time from activation of the WLs to the precharge, i.e., time required for turning on the WLs. During this time period, the voltage of this part of the word lines may be maintained at 1V.

It is to be noted that in the method for testing failure of a memory provided by the embodiments of the present disclosure, all sense amplifiers (SA) may be turned off before raising the bit line voltage, such that a function of reading data is disabled. That is, no data is read in the whole test mode.

After exiting the test mode, sense amplifiers corresponding to a preset part of bit lines may be turned off, and data is read from a remaining part of the bit lines. For the first topology data as shown in Table 1, sense amplifiers corresponding to odd-column bit lines may be turned off, and data is read from even-column bit lines. As can be seen from Table 1, data on the odd-column bit lines are all "1", and only the data of the even-column bit lines include data "0". A memory cell whose data is "0" is the memory cell to be tested, and reading data from a remaining part of the bit lines is equivalent to obtaining test data of the memory cell to be tested.

Finally, the data read from the remaining part of the bit lines may be compared with the preset storage data to obtain a comparison result, where mainly the test data in the memory cell to be tested is compared with the preset storage data. Next, a failure state of the memory may be determined according to the comparison result.

In some embodiments, the preset storage data may include preset data written into the memory cell to be tested, and the determining a failure state of the memory according to the comparison result may include: deciding whether the test data in the memory cell to be tested is the same as the preset data.

In the exemplary embodiment of the present disclosure, the preset data is "0". However, when the test data is not "0", data of the memory cell to be tested may be determined to be distorted, and it may be determined that the memory cell to be tested fails.

In the exemplary embodiment of the present disclosure, by writing the first topology data as the preset storage data into the storage array, it may be tested the failure state of the memory cell to be tested that includes data "0" among the data of the even-column bit lines in the memory.

Referring to Table 2, a distribution structure of the second topology data SUR1_1 is shown. After the second topology data is written into the memory, "1" is written into memory cells corresponding to the odd-row word lines (WL1, WL3, WL5, WL7 . . . ) and memory cells corresponding to even-column bit lines (BL0, BL2, BL4, BL8 . . . ) in the memory, and "0" is written into rest of the memory cells.

TABLE 2

| SUR1_1 | WL0 | WL1 | WL2 | WL3 | WL4 | WL5 | WL6 | WL7 |
|---|---|---|---|---|---|---|---|---|
| BL0 | 1 | 1 | 1 | 1 | 1 | 1 | 1 | 1 |
| BL1 | 0 | 1 | 0 | 1 | 0 | 1 | 0 | 1 |
| BL2 | 1 | 1 | 1 | 1 | 1 | 1 | 1 | 1 |
| BL3 | 0 | 1 | 0 | 1 | 0 | 1 | 0 | 1 |
| BL4 | 1 | 1 | 1 | 1 | 1 | 1 | 1 | 1 |
| BL5 | 0 | 1 | 0 | 1 | 0 | 1 | 0 | 1 |
| BL6 | 1 | 1 | 1 | 1 | 1 | 1 | 1 | 1 |
| BL7 | 0 | 1 | 0 | 1 | 0 | 1 | 0 | 1 |

In an exemplary embodiment of the present disclosure, after the second topology data is written into the storage array of the memory, a bit line (BL) voltage is raised. That is, the voltage of a BL is raised from a precharge voltage to an operating voltage, which is equivalent to turning on the BL, and the voltage of the BL may become 1V.

Next, a part of word lines of the storage array are controlled to enter a test mode, which is equivalent to turning on the part of the word lines in the entire storage array, such that charges on the BL may be shared onto transistor capacitors corresponding to the part of the word lines, and thus data stored in the capacitors corresponding to the part of the word lines is remained at "1".

For the second topology data, the controlling a part of word lines of the storage array to enter a test mode mainly includes: controlling to power up odd-row word lines of the storage array to enter the test mode. That is, the voltage of the odd-row word lines is maintained at a high voltage.

In this exemplary embodiment of the present disclosure, the test mode is exited after waiting for preset time, which refers to time from activation of the WLs to the precharge, i.e., time required for turning on the WLs. During this time period, the voltage of the part of the word lines may be maintained at 1V all the time.

It is to be noted that in the method for testing failure of a memory provided by the embodiments of the present disclosure, all sense amplifiers (SA) may be turned off before raising the bit line voltage, such that a function of reading data is disabled. That is, no data is read in the whole test mode.

After exiting the test mode, sense amplifiers corresponding to a preset part of bit lines may be turned off, and data is read from a remaining part of the bit lines. For the second topology data as shown in Table 2, sense amplifiers corresponding to even-column bit lines may be turned off, and data is read from odd-column bit lines. As can be seen from Table 2, the data on the even-column bit lines are all "1", only the data of the odd-column bit lines includes the data "0", and a memory cell whose data is "0" is the memory cell to be tested. Reading the data of the remaining part of the bit lines is equivalent to obtaining the test data of the memory cell to be tested.

Finally, the data read from the remaining part of the bit lines may be compared with the preset storage data to obtain a comparison result, where mainly the test data in the memory cell to be tested is compared with the preset storage data. Next, a failure state of the memory may be determined according to the comparison result.

In some embodiments, the preset storage data may include preset data written into the memory cell to be tested, and the determining a failure state of the memory according to the comparison result may include: deciding whether the test data in the memory cell to be tested is the same as the preset data.

In the exemplary embodiment of the present disclosure, the preset data is "0". However, when the test data is not "0", data of the memory cell to be tested may be determined to be distorted, and it may be determined that the memory cell to be tested fails.

In this exemplary embodiment of the present disclosure, by writing the second topology data as the preset storage data into the storage array, it may be tested the failure state of the memory cell to be tested that includes data "0" among the data of the odd-column bit lines in the memory.

Referring to Table 3, a distribution structure of the third topology data SUR1_2 is shown. After the second topology data is written into the memory, "1" is written into memory cells corresponding to the even-row word lines (WL0, WL2, WL4, WL6 . . . ) and memory cells corresponding to the odd-column bit lines (BL1, BL3, BL5, BL7 . . . ) in the memory, and "0" is written into rest of the memory cells.

TABLE 3

| SUR1_2 | WL0 | WL1 | WL2 | WL3 | WL4 | WL5 | WL6 | WL7 |
|---|---|---|---|---|---|---|---|---|
| BL0 | 1 | 0 | 1 | 0 | 1 | 0 | 1 | 0 |
| BL1 | 1 | 1 | 1 | 1 | 1 | 1 | 1 | 1 |
| BL2 | 1 | 0 | 1 | 0 | 1 | 0 | 1 | 0 |
| BL3 | 1 | 1 | 1 | 1 | 1 | 1 | 1 | 1 |
| BL4 | 1 | 0 | 1 | 0 | 1 | 0 | 1 | 0 |
| BL5 | 1 | 1 | 1 | 1 | 1 | 1 | 1 | 1 |
| BL6 | 1 | 0 | 1 | 0 | 1 | 0 | 1 | 0 |
| BL7 | 1 | 1 | 1 | 1 | 1 | 1 | 1 | 1 |

In this exemplary embodiment of the present disclosure, after the third topology data is written into the storage array of the memory, a bit line (BL) voltage is raised. That is, the voltage of a BL is raised from a precharge voltage to an operating voltage, which is equivalent to turning on the BL, and the voltage of the BL may become 1V.

Next, a part of word lines of the storage array are controlled to enter a test mode, which is equivalent to turning on the part of the word lines in the entire storage array, such that charges on the BL may be shared onto transistor capacitors corresponding to the part of the word lines, and thus data stored in the capacitors corresponding to the part of the word lines is remained at "1".

For the third topology data, the controlling a part of word lines of the storage array to enter a test mode mainly includes: controlling to power up even-row word lines of the storage array to enter the test mode. That is, the voltage of the even-row word lines is maintained at a high voltage.

In this exemplary embodiment of the present disclosure, the test mode is exited after waiting for preset time, which refers to time from activation of the WLs to the precharge, i.e., time required for turning on the WLs. During this time period, the voltage of the part of the word lines may be maintained at 1V all the time.

It is to be noted that in the method for testing failure of a memory provided by the embodiments of the present disclosure, all sense amplifiers (SA) may be turned off before raising the bit line voltage, such that a function of reading data is disabled. That is, no data is read in the whole test mode.

After exiting the test mode, sense amplifiers corresponding to a preset part of bit lines may be turned off, and data is read from a remaining part of the bit lines. For the third topology data as shown in Table 3, sense amplifiers corresponding to odd-column bit lines may be turned off, and data is read from even-column bit lines. As can be seen from Table 3, data on the odd-column bit lines are all "1", and only the data of the even-column bit lines include data "0". A memory cell whose data is "0" is the memory cell to be tested, and reading data from a remaining part of the bit lines is equivalent to obtaining test data of the memory cell to be tested.

Finally, the data read from the remaining part of the bit lines may be compared with the preset storage data to obtain a comparison result, where mainly the test data in the memory cell to be tested is compared with the preset storage data. Next, a failure state of the memory may be determined according to the comparison result.

In some embodiments, the preset storage data may include preset data written into the memory cell to be tested, and the determining a failure state of the memory according to the comparison result may include: deciding whether the test data in the memory cell to be tested is the same as the preset data.

In the exemplary embodiment of the present disclosure, the preset data is "0". However, when the test data is not "0", data of the memory cell to be tested may be determined to be distorted, and it may be determined that the memory cell to be tested fails.

In this exemplary embodiment of the present disclosure, by writing the third topology data as the preset storage data into the storage array, it may be tested the failure state of the memory cell to be tested that includes data "0" among the data of the even-column bit lines in the memory. Moreover, memory cells tested according to the third topology data are just the memory cells corresponding to the even-column bit lines that are not tested according to the first topology data.

Referring to Table 4, a distribution structure of the fourth topology data SUR1_3 is shown. After the fourth topology data is written into the memory, "1" is written into memory cells corresponding to the even-row word lines (WL0, WL2, WL4, WL6 . . . ) and memory cells corresponding to even-column bit lines (BL0, BL2, BL4, BL6 . . . ) in the memory, and "0" is written into rest of the memory cells.

TABLE 4

| SUR1_3 | WL0 | WL1 | WL2 | WL3 | WL4 | WL5 | WL6 | WL7 |
|---|---|---|---|---|---|---|---|---|
| BL0 | 1 | 1 | 1 | 1 | 1 | 1 | 1 | 1 |
| BL1 | 1 | 0 | 1 | 0 | 1 | 0 | 1 | 0 |
| BL2 | 1 | 1 | 1 | 1 | 1 | 1 | 1 | 1 |
| BL3 | 1 | 0 | 1 | 0 | 1 | 0 | 1 | 0 |
| BL4 | 1 | 1 | 1 | 1 | 1 | 1 | 1 | 1 |
| BL5 | 1 | 0 | 1 | 0 | 1 | 0 | 1 | 0 |
| BL6 | 1 | 1 | 1 | 1 | 1 | 1 | 1 | 1 |
| BL7 | 1 | 0 | 1 | 0 | 1 | 0 | 1 | 0 |

In this exemplary embodiment of the present disclosure, after the fourth topology data is written into the storage array of the memory, a bit line (BL) voltage is raised. That is, the voltage of a BL is raised from a precharge voltage to an operating voltage, which is equivalent to turning on the BL, and the voltage of the BL may become 1V.

Next, a part of word lines of the storage array are controlled to enter a test mode, which is equivalent to turning on the part of the word lines in the entire storage array, such that charges on the BL may be shared onto transistor capacitors corresponding to the part of the word lines, and thus data stored in the capacitors corresponding to the part of the word lines is remained at "1".

For the fourth topology data, the controlling a part of word lines of the storage array to enter a test mode mainly includes: controlling to power up even-row word lines of the storage array to enter the test mode. That is, the voltage of the even-row word lines is maintained at a high voltage.

In this exemplary embodiment of the present disclosure, the test mode is exited after waiting for preset time, which refers to time from activation of the WLs to the precharge, i.e., time required for turning on the WLs. During this time period, the voltage of the part of the word lines may be maintained at 1V all the time.

It is to be noted that in the method for testing failure of a memory provided by the embodiments of the present disclosure, all sense amplifiers (SA) may be turned off before raising the bit line voltage, such that a function of reading data is disabled. That is, no data is read in the whole test mode.

After exiting the test mode, the sense amplifiers corresponding to the preset part of the bit lines may be turned off, and data is read from a remaining part of the bit lines. For the fourth topology data as shown in Table 4, sense amplifiers corresponding to even-column bit lines may be turned off, and data is read from odd-column bit lines. As can be seen from Table 4, the data on the even-column bit lines are all "1", only the data of the odd-column bit lines includes the data "0", and a memory cell whose data is "0" is the memory cell to be tested. Reading the data of the remaining part of the bit lines is equivalent to obtaining the test data of the memory cell to be tested.

Finally, the data read from the remaining part of the bit lines may be compared with the preset storage data to obtain a comparison result, where mainly the test data in the memory cell to be tested is compared with the preset storage data. Next, a failure state of the memory may be determined according to the comparison result.

In some embodiments, the preset storage data may include preset data written into the memory cell to be tested, and the determining a failure state of the memory according to the comparison result may include: deciding whether the test data in the memory cell to be tested is the same as the preset data.

In this exemplary embodiment of the present disclosure, the preset data is "0". However, when the test data is not "0", data of the memory cell to be tested may be determined to be distorted, and it may be determined that the memory cell to be tested fails.

In this exemplary embodiment of the present disclosure, by writing the fourth topology data as preset storage data into the storage array, it may be tested the failure state of the memory cell to be tested that includes data "0" among the data of the odd-column bit lines in the memory. Moreover, memory cells tested according to the fourth topology data are just the memory cells corresponding to the odd-column bit lines that are not tested according to the second topology data.

In practical applications, any one or more of the first topology data, the second topology data, the third topology data or the fourth topology data may be selected as the preset storage data to perform failure determination on a part of memory cells in the memory. Furthermore, the first topology data, the second topology data, the third topology data and the fourth topology data may also be combined to complete the failure determination of all the memory cells in the memory. In the process of combining the above four topology data, the above-mentioned failure determination is still performed based on the four topology data respectively, which is not to be repeated here.

Figure 4:
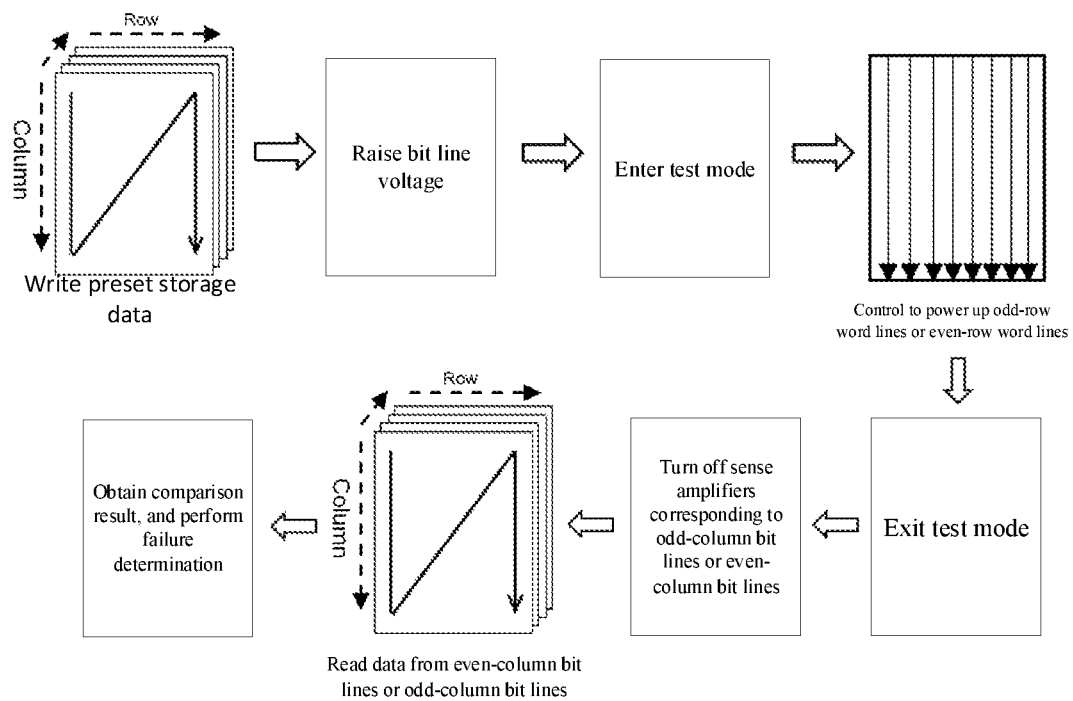
FIG. 4 schematically illustrates a schematic flow block diagram of the method for testing failure of a memory according to an exemplary embodiment of the present disclosure.

For the four topology data, bit lines or word lines to be turned on or off are different, but they have the same flow in the method for testing failure of a memory. Referring to FIG. 4, a schematic flow block diagram of the method for testing failure of a memory according to an exemplary embodiment of the present disclosure is illustrated. First, the preset storage data is written into the storage array of the memory along a direction of the word lines. Next, a bit line voltage is raised, then odd-row word lines or even-row word lines of the storage array are controlled to be powered up to enter a test mode, and then the test mode is exited after waiting for preset time. Next, sense amplifiers corresponding to odd-column bit lines or even-column bit lines are turned off, and data is read from the even-column bit lines or odd-column bit lines. Finally, a comparison result is obtained, and a failure determination is performed based on the comparison result.

To sum up, in the method for testing failure of a memory provided by the exemplary embodiments of the present disclosure, by raising the bit line voltage and controlling to power up the odd-row word lines or even-row word lines, the odd-row word lines or even-row word lines may be maintained at a high voltage, such that a voltage difference between the memory cells is maintained, thereby achieving the test of the memory cell to be tested.

It is to be noted that steps of the method in the present disclosure are described in a particular order in the accompanying drawings. However, this does not require or imply to execute these steps necessarily according to the particular order, or this does not mean that the expected result cannot be implemented unless all the shown steps are executed. Additionally, some steps may be omitted, a plurality of steps may be combined into one step for execution, and/or one step may be decomposed into a plurality of steps for execution.

Figure 5:
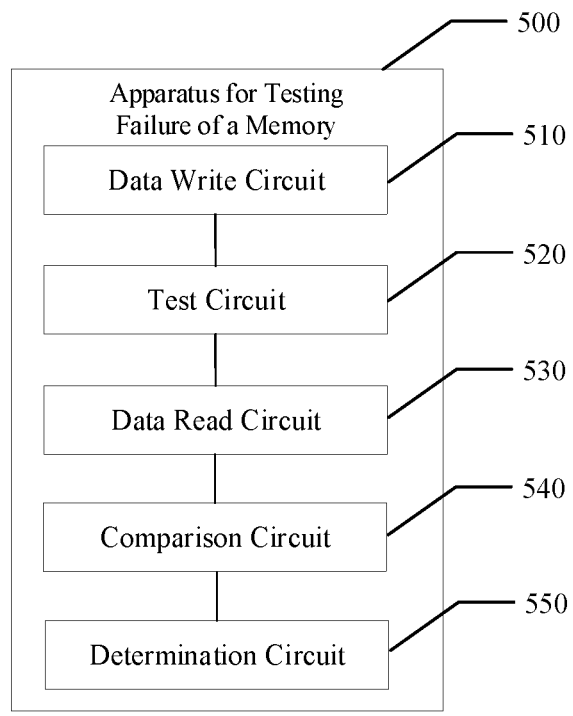
FIG. 5 schematically illustrates a block diagram of an apparatus for testing failure of a memory according to an exemplary embodiment of the present disclosure.

In addition, in this exemplary embodiment, an apparatus for testing failure of a memory is also provided. Referring to FIG. 5, the apparatus 500 for testing failure of a memory may include: a data write circuit 510, a test circuit 520, a data read circuit 530, a comparison circuit 540, and a determination circuit 550.

The data write circuit 510 may be configured to write preset storage data into a storage array of the memory.

The test circuit 520 may be configured to raise a bit line voltage, control a part of word lines of the storage array to enter a test mode, and exit the test mode after waiting for preset time.

The data read circuit 530 may be configured to turn off sense amplifiers corresponding to a preset part of bit lines, and read data from a remaining part of the bit lines.

The comparison circuit 540 may be configured to compare the data read from the remaining part of the bit lines with the preset storage data to obtain a comparison result.

The determination circuit 550 may be configured to determine a failure state of the memory according to the comparison result.

In an exemplary embodiment of the present disclosure, the test circuit 520 may also be configured to raise the voltage of the bit lines from a precharge voltage to an operating voltage.

In an exemplary embodiment of the present disclosure, the preset time is time from activation of the word lines to the precharge.

In an exemplary embodiment of the present disclosure, the data read circuit 530 may be configured to obtain test data of a memory cell to be tested.

In an exemplary embodiment of the present disclosure, the determination circuit 550 may be configured to decide whether the test data is the same as preset data, the preset storage data comprising the preset data written into the memory cell to be tested.

In an exemplary embodiment of the present disclosure, the preset data is "0", and the determination circuit 550 may be configured to determine that when the test data is not "0", data of the memory cell to be tested is distorted, and the memory cell to be tested is failed.

In an exemplary embodiment of the present disclosure, the test circuit 520 may be configured to control to power up odd-row word lines or even-row word lines of the storage array to enter the test mode.

In an exemplary embodiment of the present disclosure, the preset storage data includes first topology data, after the first topology data is written into the memory, "1" is written into memory cells corresponding to the odd-row word lines and memory cells corresponding to odd-column bit lines in the memory, and "0" is written into rest of the memory cells.

In an exemplary embodiment of the present disclosure, when writing the first topology data, the test circuit 520 may be configured to control to power up the odd-row word lines of the storage array; and the data read circuit 530 may be configured to turn off the sense amplifiers corresponding to the odd-column bit lines, and read data from even-column bit lines.

In an exemplary embodiment of the present disclosure, the preset storage data includes second topology data, after the second topology data is written into the memory, "1" is written into memory cells corresponding to the odd-row word lines and memory cells corresponding to even-column bit lines in the memory, and "0" is written into rest of the memory cells.

In an exemplary embodiment of the present disclosure, when writing the second topology data, the test circuit 520 may be configured to control to power up the odd-row word lines of the storage array; and the data read circuit 530 may be configured to turn off the sense amplifiers corresponding to the even-column bit lines, and read data from odd-column bit lines.

In an exemplary embodiment of the present disclosure, the preset storage data includes third topology data, after the third topology data is written into the memory, "1" is written into memory cells corresponding to the even-row word lines and memory cells corresponding to odd-column bit lines in the memory, and "0" is written into rest of the memory cells.

In an exemplary embodiment of the present disclosure, when writing the third topology data, the test circuit 520 may be configured to control to power up the even-row word lines of the storage array; and the data read circuit 530 may be configured to turn off the sense amplifiers corresponding to the odd-column bit lines, and read data from even-column bit lines.

In an exemplary embodiment of the present disclosure, the preset storage data includes fourth topology data, after the fourth topology data is written into the memory, "1" is written into memory cells corresponding to the even-row word lines and memory cells corresponding to even-column bit lines in the memory, and "0" is written into rest of the memory cells.

In an exemplary embodiment of the present disclosure, when writing the fourth topology data, the test circuit 520 may be configured to control to power up the even-row word lines of the storage array; and the data read circuit 530 may be configured to turn off the sense amplifiers corresponding to the even-column bit lines, and read data from odd-column bit lines.

Concrete details of virtual circuits of the above-mentioned apparatus for testing failure of a memory have been described in detail in the corresponding method for testing failure of a memory, and thus are not to be repeated here.

It is to be noted that although a plurality of circuits or units of the apparatus for testing failure of a memory have been mentioned in the above detailed description, this division is not mandatory. Actually, according to the embodiments of the present disclosure, features and functions of two or more circuits or units as described above may be embodied in one circuit or unit. Conversely, features and functions of one circuit or unit as described above may be further embodied in more circuits or units.

In an exemplary embodiment of the present disclosure, there is further provided an electronic device capable of implementing the above method.

As can be appreciated by one skilled in the art, aspects of the present disclosure may be embodied as a system, method or program product. Accordingly, aspects of the present disclosure may take the form of an entirely hardware embodiment, an entirely software embodiment (including firmware, micro-code, etc.) or an embodiment combining software and hardware aspects that may all generally be referred to herein as a "circuit," "circuit" or "system."

The electronic device 600 according to this embodiment of the present disclosure is described below with reference to FIG. 6. The electronic device 600 as shown in FIG. 6 is merely an example, and no limitation should be imposed on functions or scope of use of the embodiment of the present disclosure.

Figure 6:
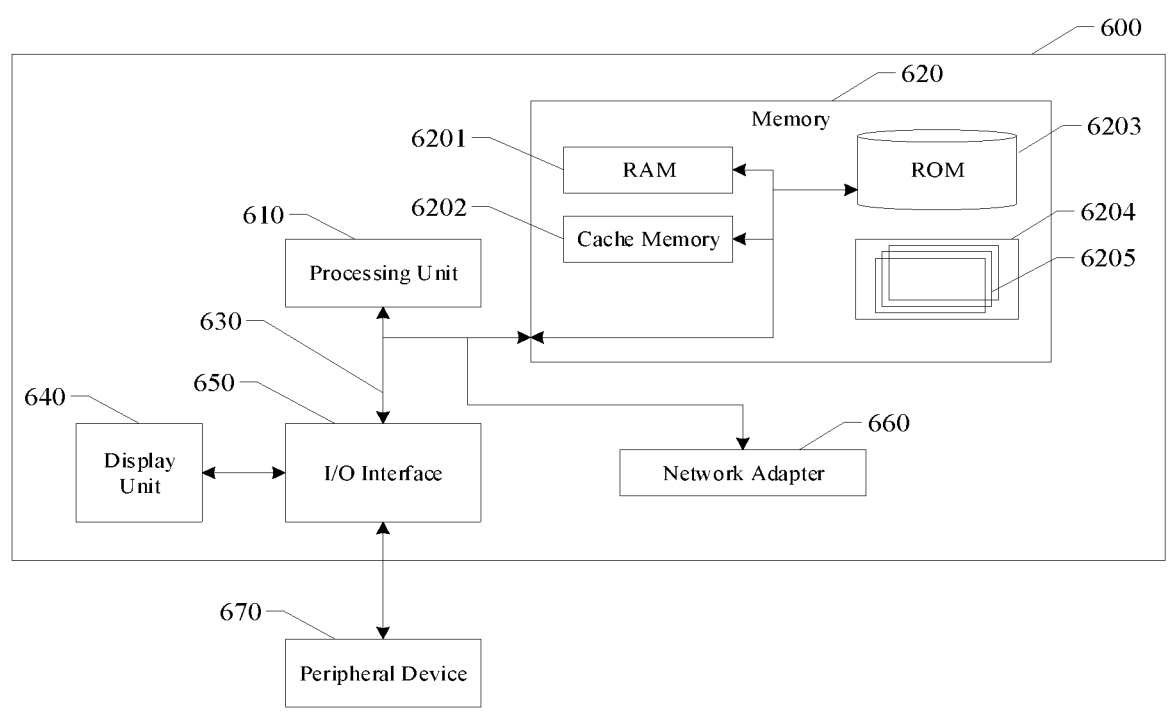
FIG. 6 schematically illustrates a schematic circuit diagram of an electronic device according to an exemplary embodiment of the present disclosure.

As shown in FIG. 6, the electronic device 600 is shown in the form of a general-purpose computing device. Components of the electronic device 600 may include, but are not limited to: at least one processing unit 610, at least one memory 620, a bus 630 connecting different system components (including the memory 620 and the processing unit 610), and a display unit 640.

The memory 620 stores a program code, which may be executed by the processing unit 610, such that the processing unit 610 performs steps described in the "exemplary method" portions of this specification according to exemplary embodiments of the present disclosure. For example, the processing unit 610 may perform the steps shown in FIG. 3.

The memory 620 may include readable media in the form of volatile memory, such as a random access memory (RAM) 6201 and/or a cache memory 6202. Furthermore, the memory 620 may further include a read-only memory (ROM) 6203.

The memory 620 may include a program/utility tool 6204 having a group of (at least one) program circuits 6205. The program circuits 6205 include, but are not limited to: an operating system, one or more applications, other program circuits and program data. Each or a certain combination of these examples may include implementation of network environment.

The bus 630 may represent one or more of a plurality of bus structures, including a memory bus or memory controller, a peripheral bus, an accelerated graphics port, a processing unit or a local bus using any bus structure among the plurality of bus structures.

The electronic device 600 may communicate with one or more peripheral devices 670 (such as keyboards, pointing devices, Bluetooth devices, etc.), and also may communicate with one or more devices allowing a user to interact with the electronic device 600, and/or may communicate with any device (for example, a router, a modem and so on) allowing the electronic device 600 to communicate with one or more other computing devices. This communication may be implemented by means of an input/output (I/O) interface 650. Moreover, the electronic device 600 also may communicate with one or more networks (for example, a local area network (LAN), a wide area network (WAN) and/or a public network such as the Internet) via a network adapter 660. As shown in FIG. 6, the network adapter 660 communicates with other circuits of the electronic device 600 through the bus 630. It should be understood that although not shown in the figures, other hardware and/or software circuits may be used in combination with the electronic device 600, including but not limited to: microcode, device drivers, redundancy processing units, external disk drive arrays, redundant arrays of independent disks (RAID) systems, tape drives and data backup and storage systems, etc.

With description of the above embodiments, it will be readily understood by those skilled in the art that the exemplary embodiments described herein may be implemented by software or may be implemented by means of software in combination with the necessary hardware. Thus, the technical solutions according to the embodiments of the present disclosure may be embodied in the form of a software product which may be stored in a nonvolatile storage medium (which may be CD-ROM, USB flash disk, mobile hard disk and the like) or on network, including a number of instructions for enabling a computing device (which may be a personal computer, a server, a terminal device, or a network device and the like) to perform the method according to the embodiments of the present disclosure.

In an exemplary embodiment of the present disclosure, there is further provided a computer-readable storage medium storing a program product capable of implementing the above method in this specification. In some possible embodiments, aspects of the present disclosure may be implemented as a form of a program product, which includes a program code. When the program product runs on the terminal device, the program code is used for enabling the terminal device to perform the steps described in the above "exemplary method" portions of this specification according to the exemplary embodiments of the present disclosure.

The program product configured to implement the above method according to the embodiments of the present disclosure may adopt a portable compact disc read-only memory (CD-ROM) and include a program code, and may run on a terminal device such as a personal computer. However, the program product of the present disclosure is not limited thereto. In this document, a readable storage medium may be any tangible medium that can contain or store a program for use by or in connection with an instruction execution system, apparatus, or device.

Any combination of one or more readable medium(s) may be utilized by the program product. The readable medium may be a readable signal medium or a readable storage medium. The readable storage medium may be, for example, but not limited to, an electronic, magnetic, optical, electro-magnetic, infrared, or semiconductor system, apparatus, or device, or any suitable combination of the foregoing. More concrete examples (a non-exhaustive list) of the readable storage medium include the following: an electrical connection having one or more wires, a portable diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

A computer-readable signal medium may include a propagated data signal with readable program code embodied therein, for example, in baseband or as part of a carrier wave. Such a propagated data signal may take any of a variety of forms, including, but not limited to, electro-magnetic, optical, or any suitable combination thereof. The readable signal medium may be any readable medium that is not a readable storage medium and that can communicate, propagate, or transport a program for use by or in connection with an instruction execution system, apparatus, or device.

Program code embodied on a readable medium may be transmitted using any appropriate medium, including but not limited to wireless, wireline, optical fiber cable, RF, etc., or any suitable combination of the foregoing.

Program code for carrying out operations of the present disclosure may be written in any combination of one or more programming languages, including an object-oriented programming language such as Java, C++ or the like and conventional procedural programming languages, such as the "C" programming language or similar programming languages. The program code may execute entirely on the user's computing device, partly on the user's computing device, as a stand-alone software package, partly on the user's computing device and partly on a remote computing device or entirely on the remote computing device or server. In a scenario involved with a remote computing device, the remote computing device may be coupled to the user's computing device through any type of network, including a local area network (LAN) or a wide area network (WAN), or may be coupled to an external computing device (for example, through the Internet using an Internet Service Provider).

Moreover, the above accompanying drawings are merely illustrative description of processes included in the method according to the exemplary embodiments of the present disclosure and are not intended to limit the present disclosure. It is easy to understand that the processes shown in the above accompanying drawings do not indicate or limit time sequences of these processes. Furthermore, it is also easy to understand that these processes may be executed, for example, synchronously or asynchronously in a plurality of circuits.

Other embodiments of the present disclosure will be apparent to those skilled in the art from consideration of the specification and practice of the present disclosure disclosed here. This application is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the present disclosure is only limited by the appended claims.

What is claimed is:

1. A method for testing failure of a memory, comprising:
writing preset storage data into a storage array of the memory;

raising a bit line voltage, and controlling a part of word lines of the storage array to enter a test mode;
exiting the test mode after waiting for preset time;
turning off sense amplifiers corresponding to a preset part of bit lines, and reading data from a remaining part of the bit lines;
comparing the data read from the remaining part of the bit lines with the preset storage data to obtain a comparison result; and
determining a failure state of the memory according to the comparison result.

2. The method for testing failure of a memory according to claim 1, wherein the raising a bit line voltage comprises: raising the voltage of the bit lines from a precharge voltage to an operating voltage.

3. The method for testing failure of a memory according to claim 1, wherein the preset time is time from activation of the word lines to a precharge.

4. The method for testing failure of a memory according to claim 1, wherein the reading data from a remaining part of the bit lines comprises: obtaining test data of a memory cell to be tested.

5. The method for testing failure of a memory according to claim 4, wherein the determining a failure state of the memory according to the comparison result comprises:
deciding whether the test data is the same as preset data, the preset storage data comprising the preset data written into the memory cell to be tested.

6. The method for testing failure of a memory according to claim 5, wherein the preset data being "0", when the test data is not "0", data of the memory cell to be tested is determined to be distorted, and the memory cell to be tested is failed.

7. The method for testing failure of a memory according to claim 1, wherein the controlling a part of word lines of the storage array to enter a test mode comprises:
controlling to power up odd-row word lines or even-row word lines of the storage array to enter the test mode.

8. The method for testing failure of a memory according to claim 7, wherein the preset storage data comprising first topology data, after the first topology data is written into the memory, "1" is written into memory cells corresponding to the odd-row word lines and memory cells corresponding to odd-column bit lines in the memory, "0" being written into rest of the memory cells.

9. The method for testing failure of a memory according to claim 8, further comprising:
when writing the first topology data, controlling to power up the odd-row word lines of the storage array; and turning off the sense amplifiers corresponding to the odd-column bit lines, and reading data from even-column bit lines.

10. The method for testing failure of a memory according to claim 7, wherein the preset storage data comprising second topology data, after the second topology data is written into the memory, "1" is written into memory cells corresponding to the odd-row word lines and memory cells corresponding to even-column bit lines in the memory, "0" being written into rest of the memory cells.

11. The method for testing failure of a memory according to claim 10, further comprising:
when writing the second topology data, controlling to power up the odd-row word lines of the storage array; and turning off the sense amplifiers corresponding to the even-column bit lines, and reading data from odd-column bit lines.

12. The method for testing failure of a memory according to claim 7, wherein the preset storage data comprising third topology data, after the third topology data is written into the memory, "1" is written into memory cells corresponding to the even-row word lines and memory cells corresponding to odd-column bit lines in the memory, "0" being written into rest of the memory cells.

13. The method for testing failure of a memory according to claim 12, further comprising:
when writing the third topology data, controlling to power up the even-row word lines of the storage array; and turning off the sense amplifiers corresponding to the odd-column bit lines, and reading data from even-column bit lines.

14. The method for testing failure of a memory according to claim 7, wherein the preset storage data comprising fourth topology data, after the fourth topology data is written into the memory, "1" is written into memory cells corresponding to the even-row word lines and memory cells corresponding to even-column bit lines in the memory, "0" being written into rest of the memory cells.

15. The method for testing failure of a memory according to claim 14, further comprising:
when writing the fourth topology data, controlling to power up the even-row word lines of the storage array; and turning off the sense amplifiers corresponding to the even-column bit lines, and reading data from odd-column bit lines.

16. An apparatus for testing failure of a memory, comprising:
a data write circuit configured to write preset storage data into a storage array of the memory;
a test circuit configured to raise a bit line voltage, control a part of word lines of the storage array to enter a test mode, and exit the test mode after waiting for preset time;
a data read circuit configured to turn off sense amplifiers corresponding to a preset part of bit lines, and read data from a remaining part of the bit lines;
a comparison circuit configured to compare the data read from the remaining part of the bit lines with the preset storage data to obtain a comparison result; and
a determination circuit configured to determine a failure state of the memory according to the comparison result.

17. An electronic device comprising:
a processor; and
a memory configured to store executable instructions of the processor;
wherein the processor is configured to execute the executable instructions to implement a method for testing failure of a memory, wherein the method comprises:
writing preset storage data into a storage array of the memory;
raising a bit line voltage, and controlling a part of word lines of the storage array to enter a test mode;
exiting the test mode after waiting for preset time;
turning off sense amplifiers corresponding to a preset part of bit lines, and reading data from a remaining part of the bit lines;
comparing the data read from the remaining part of the bit lines with the preset storage data to obtain a comparison result; and
determining a failure state of the memory according to the comparison result.

* * * * *